United States Patent [19]

West et al.

[11] Patent Number: 4,578,602

[45] Date of Patent: Mar. 25, 1986

[54] VOLTAGE SIGNAL TRANSLATOR

[75] Inventors: Jeffery A. West, Pleasant Grove, Utah; Thomas D. Fletcher, Wijchen, Netherlands

[73] Assignee: Signetics Corporation, Sunnyvale, Calif.

[21] Appl. No.: 512,269

[22] Filed: Jul. 11, 1983

[51] Int. Cl.⁴ .................. H03K 15/092; H03K 3/01
[52] U.S. Cl. .................. 307/475; 307/264; 307/296 R
[58] Field of Search ............ 307/475, 264, 297, 254, 307/296 R

[56] References Cited

U.S. PATENT DOCUMENTS

| | | | |
|---|---|---|---|
| 3,778,640 | 12/1973 | Platt et al. | 307/254 |
| 3,986,045 | 10/1976 | Lutz | 307/317 A |
| 4,528,463 | 7/1985 | Kung | 307/296 R |

FOREIGN PATENT DOCUMENTS 0009083  4/1980  European Pat. Off. .

*Primary Examiner*—Stanley D. Miller
*Assistant Examiner*—B. P. Davis
*Attorney, Agent, or Firm*—R. J. Meetin; R. T. Mayer; T. A. Briody

[57] ABSTRACT

A bipolar signal translator contains a pair of transistors (Q1 and Q2) arranged as a current mirror with their emitters coupled to a voltage supply ($V_{EE}$) by way of a pair of impedance elements (R4 and R5) that improve stability. Their collectors are coupled through another pair of impedance elements (R1 and R2) to an input transistor (Q4 or Q5) and to a device circuit (D1 and D2, D3 and D4, or Q4). The collector of one of the current-mirror transistors (Q2) is coupled to the base of an output transistor (Q3) whose collector is preferably coupled through an output impedance element (R3) to a current-control transistor (Q6) that improves power utilization.

11 Claims, 3 Drawing Figures

VOLTAGE SIGNAL TRANSLATOR

FIELD OF USE

This invention relates generally to signal translators suitable for semiconductor integrated circuits and particularly to such translators that convert input voltages at given voltage levels into output voltages at different voltage levels.

BACKGROUND ART

In some conventional bipolar signal translators, a pair of interconnected element stacks are used in performing voltage translation. S. Platt et al disclose such a translator for converting an input voltage signal into an output voltage signal at a different voltage level in U.S. Pat. No. 3,788,640. The element stacks in this single-input device are connected to each other through a pair of lower NPN transistors configured as a current mirror. The base of a first of the lower transistors is connected directly to its collector and to the base of the second lower transistor. The emitters of both lower transistors are tied directly to a low voltage supply.

In one version of Platt et al, the collector of the first lower transistor is coupled through a first resistor to the emitter of an upper NPN reference transistor whose base receives a fixed reference voltage. The collector of the second lower transistor is coupled through a second resistor to the emitter of an upper NPN input transistor whose base receives the input voltage. The collectors of both upper transistors are tied directly to a high voltage supply. The collector of the second lower transistor also drives the base of an NPN output transistor whose collector is coupled through a pull-up output resistor to the high voltage supply and whose emitter is tied to the low voltage supply. The collector of the output transistor provides the output voltage.

All of the transistors in Platt et al are conductive except for the output transistor which normally switches on and off. When the input voltage equals the reference voltage, the voltage at the base of the output transistor is at a selected nominal value below the input voltage. Because of the current mirror, the currents through the element stacks are virtually equal. When the input voltage changes, the base voltage of the output transistor changes by approximately the same amount and in the same direction. This causes the output transistor either to turn on and saturate if the input voltage change is sufficiently positive or to turn off if the input change is sufficiently negative.

In another version of Platt et al, the reference and input voltages are reversed—i.e., the input voltage is supplied to the upper transistor which previously received the reference voltage, and vice versa. As a result, the currents through the element stacks are variable, though still substantially equal. A change in the input voltage above or below the reference voltage causes the base voltage of the output transistor to change by the same amount but in the opposite direction. The output transistor then turns on if the input voltage change is sufficiently positive, and vice versa.

The translators of Platt et al appear capable of generally providing good voltage translation. However, noise at the low voltage supply can cause instability because only the base-emitter junctions of the lower transistors are present to receive the noise. In addition, power is wasted since only the output resistor lies between the high voltage supply and the output point.

In U.S. Pat. No. 3,986,045, R. Lutz discloses an emitter-coupled logic-to-transistor-transistor logic (ECL-to-TTL) translator configured similarly to Platt et al. Input signals of opposite logical polarity are supplied to the upper transistors to make the Lutz device a differential-input translator. In addition to this, there are several configurational differences. The base of the first lower transistor is coupled to its collector by way of the base-emitter junction of an NPN feedback transistor. This feedback coupling is undesirable in some applications since it might cause oscillations in the feedback loop. Resistors in the emitters of the lower transistors are employed to improve stability. The upper end of the output resistor is connected to the transistor emitter connected to the first resistor so as to enable the output transistor to saturate more rapidly. This connection can, however, create difficulty in the current matching between the lower transistors.

W. Wilhelm discloses another similar differential-input translator in published European Patent Application No. 009083 in which the lower transistors are again arranged as a current mirror with their emitters tied directly to the low voltage supply as in Platt et al. The Wilhelm device thus has basically the same deficiencies as Platt et al.

DISCLOSURE OF THE INVENTION

A signal translator for converting an input voltage signal into an output voltage signal at a different voltage level in accordance with the invention contains four like-polarity bipolar transistors referred to as the first, second, input, and output transistors. The base of the first transistor is connected directly both to its collector and to the base of the second transistor. The collector of the first transistor is coupled to one end of a first impedance element. The collector of the second transistor is similarly coupled to one end of a second impedance element. The collector of the second transistor is also coupled to the base of the output transistor whose emitter is coupled to a first voltage supply and whose collector is coupled through an output impedance element to a second voltage supply. The collector of the output transistor provides the output signal. The input signal drives the base of the input transistor. Its emitter is coupled to the other end of one of the first and second impedance elements, while its collector is coupled to the second voltage supply. A device circuit provides a selected voltage to the other end of the other of the first and second impedance elements. Importantly, a pair of impedance elements are respectively coupled between the first voltage supply on one hand and the emitters of the first and second transistors on the other hand. Part of the voltage difference between their interconnected bases and the first voltage supply occurs across these emitter impedance elements. This reduces the sensitivity to noise and markedly improves stability.

In one embodiment of the invention, the present translator is a single-input device in which the output signal is logically the same as the input signal. The emitter of the input transistor is coupled to the first impedance element here. The device circuit preferably contains one or more diodes coupled to the second supply for providing the selected voltage as a reference voltage to the second impedance element. A separate like-polarity current-control bipolar transistor responsive to the input signal is preferably collector-emitter coupled between the second supply and the output impedance element. By reducing the output current when the output signal is at a low logical value and less output current is needed, this transistor improves power utilization without harming the current matching between the first and second transistors.

In a second embodiment, the present translator is another single-input device in which the output signal is logically inverted with respect to the input signal. The emitter of the input transistor is coupled to the second impedance element in this case. The device circuit preferably contains one or more diodes coupled to the second supply for similarly providing the selected voltage as a reference voltage to the first impedance element.

In a third embodiment, the present translator is a differential-input device in which the emitter of the input transistor is again coupled to the second impedance element. The device circuit contains a further like-polarity input bipolar transistor collector-emitter coupled between the second supply and the first impedance element. The base of the further input transistor normally receives a signal complementary to the input signal. A like-polarity current-control bipolar transistor whose base receives the complementary input signal is again preferably collector-emitter coupled between the second supply and the output impedance element. The current-control transistor improves power utilization in the manner described above.

Each impedance element in the foregoing embodiments is preferably a resistor, while the transistors are NPN devices. With the input signal(s) at normal ECL levels, appropriate choice for the resistor values enables the output signal to be at clearly defined TTL levels.

Figure 1:
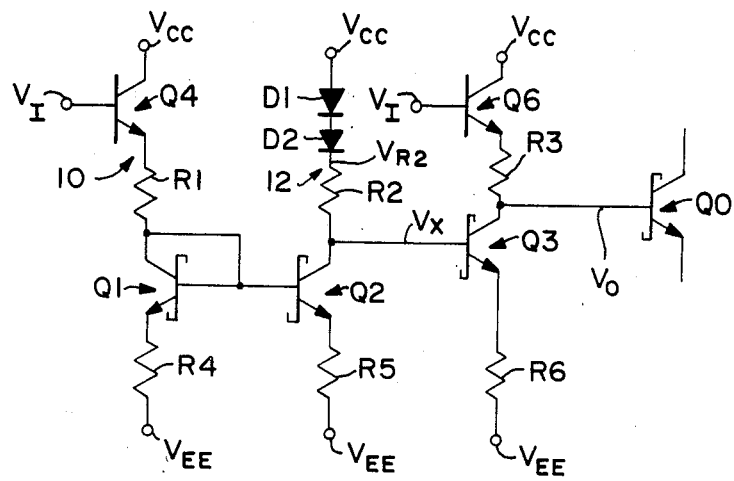
FIG. 1 is a circuit diagram of an embodiment of a single-input signal translator in accordance with the invention.

Each Schottky diode whose anode is connected to the base of an NPN transistor and whose cathode is connected to the collector of the transistor so as to clamp it out of deep saturation is not shown in the drawings. Instead, the base of each such Schottky-clamped NPN transistor is illustrated as a long block "S" to represent the clamping Schottky diode.

Like reference symbols are employed in the drawings and in the description of the preferred embodiments to represent the same or very similar item or items.

DESCRIPTION OF THE PREFERRED EMBODIMENTS

Referring to the drawings, FIG. 1 illustrates a single-input non-inverting ECL-to-TTL bipolar translator for converting an ECL input voltage signal $V_I$ into a TTL output voltage signal $V_O$ at a different voltage level. The translator contains a pair of element stacks 10 and 12 connected to each other through a current mirror consisting of identical always-on Schottky-clamped NPN transistors Q1 and Q2. The base of transistor Q1 is connected directly to its collector and also to the base of transistor Q2. Its collector provides a voltage $V_X$ to the base of a Schottky-clamped switching NPN output transistor Q3.

In stack 10, the collector of transistor Q1 is connected to the lower end of a resistor R1. Its upper end is connected to the emitter of an always-on NPN input transistor Q4 whose base receives input voltage $V_I$. The collector of transistor Q4 is tied to a source of a high supply voltage $V_{CC}$ of about 5 volts.

In stack 12, the collector of transistor Q2 is connected to the lower end of a resistor R2 whose resistance $R_2$ is preferably the same as the resistance $R_1$ of resistor R1. The upper end of resistor R2 receives a reference voltage $V_{R2}$ from a device circuit consisting of a pair of serially coupled always-on PN-junction diodes D1 and D2 connected between the $V_{CC}$ supply and the upper end of resistor R2 in the normal conductive direction of the base-emitter junction of transistor Q2. Each diode D1 or D2 is preferably formed by connecting together the base and collector of an NPN transistor. The voltage drop across each diode D1 or D2 is then $1V_{BE}$ where $V_{BE}$ is the standard forward voltage drop across the base-emitter junction of a bipolar transistor when it is just conductively forward biased. Accordingly, reference voltage $V_{R2}$ equals $V_{CC}-2V_{BE}$ where $V_{BE}$ is about 0.8 volt for an NPN transistor at room temperature.

The collector of transistor Q3 supplies output voltage $V_O$ which normally goes to the base of a Schottky-clamped NPN phase-splitting transistor Q0 of a TTL gate. The collector of transistor Q3 is also connected to the lower end of a pull-up output resistor R3 whose resistance $R_3$ is of the same order of magnitude as $R_1$ or $R_2$. The upper end of resistor R3 is connected to the emitter of an always-on NPN current-control transistor Q6. Its base receives input $V_I$, while its collector is tied to the $V_{CC}$ supply.

The emitters of transistor Q1 and Q2 are coupled respectively through resistors R4 and R5 to a low voltage supply $V_{EE}$ at ground reference (0 volt). The resistances $R_4$ and $R_5$ of resistors R4 and R5, respectively, are preferably the same and are much smaller than $R_1$ and $R_2$—normally about 1–2 orders of magnitude less. The emitter of transistor Q3 is likewise coupled to the $V_{EE}$ supply through a resistor R6 whose resistance $R_6$ is of the same order of magnitude as $R_4$ or $R_5$.

Resistors R4 and R5 improve translator stability. When noise appears at the Q1 and Q2 bases, resistors R4 and R5 take up part of the resulting voltage change that would otherwise occur across the Q1 and Q2 base-emitter junctions. This reduces the undesired voltage change across the base-emitter junctions of transistors Q1 and Q2 and the consequent current change through them so as to make the translator less sensitive to noise.

During operation, the switching point for input $V_I$ is $V_{CC}-0.5V_{BE}$. Voltage $V_I$ swings upward $0.5V_{BE}$ to a nominal ECL logical "1" value of $V_{CC}$ and downward $0.5V_{BE}$ to a nominal ECL logical "0" value of $V_{CC}-V_{BE}$. The nominal TTL $V_O$ logical "1" level is 2.0 volts or more, while the nominal TTL $V_O$ logical "0" level is 0.8 volt or less.

The translator of FIG. 1 operates in the following manner. When voltage $V_I$ changes by an amount $\Delta V$, the Q4 emitter voltage likewise changes by approximately $\Delta V$, causing the current through stack 10 to change by an amount $\Delta I$ which is positive if $\Delta V$ is positive and vice versa. $\Delta I$ is approximately $\Delta V/R_1$ since $R_4$ is very small compared to $R_1$.

Ignoring the small currents needed to drive transistors Q1, Q2, and Q3, the current through stack 12 always equals the current through stack 10 because R4 and R5 are equal and because of the current mirror Q1 and Q2. Accordingly, the current through stack 12 changes by $\Delta I$. The voltage drop across resistor R2 then changes by $R_2\Delta I$ which equals $\Delta V$ since $R_2$ equals $R_1$. Inasmuch as reference $V_{R2}$ is constant (i.e., $V_{R2}$ does not vary significantly as the current through stack 12 changes), $V_X$ changes by $-\Delta V$. In other words, voltage $V_X$ changes by the same amount as input $V_I$ but in the opposite direction.

When input $V_I$ is raised to its "1", voltage $V_X$ drops to its lowest value to turn off transistor Q3 and bring output $V_O$ up to its "1". The reverse occurs when input $V_I$ is dropped $1V_{BE}$ to its "0". Voltage $V_X$ rises to its highest value, enabling transistor Q3 to turn on and pull output $V_O$ down to its "0". The total potential swing in voltage $V_X$ is $1V_{BE}$.

Transistor Q6 tailors the current provided from the $V_{CC}$ supply to the needs of the output load Q0. When output $V_O$ is at "1", transistor Q0 is turned on and needs drive current. Since input $V_I$ is at "1", transistor Q6 is at its maximum conductive level and allows the necessary drive current to flow from the $V_{CC}$ supply to the Q0 base. On the other hand, transistor Q0 is turned off and does not need drive current when output $V_O$ is at "0". A current path from the $V_{CC}$ supply then exists through transistor Q3 which is turned on. Transistor Q6 is then at its minimum operating conductive level since input $V_I$ is at "0" so as to reduce the current flow appropriately. In short, transistor Q6 improves power utilization by preventing unnecessary power dissipation. Transistor Q6 also increases translator speed.

Figure 2:
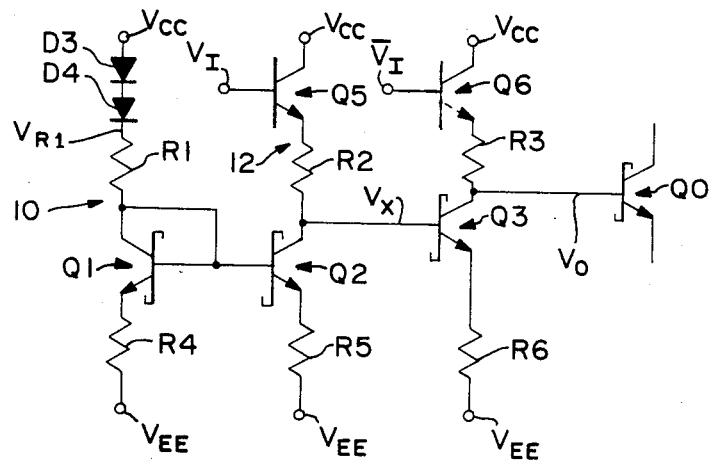
FIG. 2 is a circuit diagram of an embodiment of another single-input signal translator in accordance with the invention.

Turning to FIG. 2, it shows a single-input inverting ECL-to-TTL bipolar translator which converts ECL input voltage $V_I$ into TTL output voltage $V_O$ for driving phase splitter Q0. This translator contains transistors Q1-Q3 and resistors R1-R6 all configured the same and having the same characteristics as in FIG. 1. Resistors R4 and R5 in FIG. 2 perform the same function as in FIG. 1.

In FIG. 2, the upper end of resistor R1 receives a reference voltage $V_{R1}$ from a device circuit consisting of a pair of serially coupled always-on PN-junction diodes D3 and D4 connected between the $V_{CC}$ supply and resistor R1 in the normal conductive direction of the Q1 base-emitter junction. Each diode D3 or D4 is substantially equivalent to diode D1 or D2 so that reference $V_{R1}$ is $V_{CC} - 2V_{BE}$. The upper end of resistor R2 is connected to the emitter of an always-on NPN input transistor Q5 whose base receives input voltage $V_I$. The collector of transistor Q5 is tied to the $V_{CC}$ supply. The upper end of resistor R3 is normally tied directly to the $V_{CC}$ supply. If an ECL input voltage signal $\overline{V}_I$ complementary to signal $V_I$ is available, current-control transistor Q6 is collector-emitter connected between the $V_{CC}$ supply and resistor R3. In this case, the Q6 base receives complementary input $\overline{V}_I$.

The switching points and input/output logical levels for the translator of FIG. 2 are the same as those for FIG. 1. In contrast to FIG. 1, the current through stack 10 in FIG. 2 is substantially constant since $V_{R1}$ is constant. Accordingly, the current through stack 12 is also constant. When $V_I$ in FIG. 2 changes by $\Delta V$, the voltage at the Q5 emitter likewise changes by approximately $\Delta V$. Because the current through resistor R2 is constant, $V_X$ also changes by $\Delta V$. If $V_I$ is at "1", $V_X$ is high. This turns on transistor Q3 to pull $V_O$ down to "0". If $V_I$ is at "0", $V_X$ is low. This turns off transistor Q3 to enable $V_O$ to rise to "1".

If the translator of FIG. 2 includes transistor Q6, it tailors the current provided from the $V_{CC}$ supply to the output needs in the same manner as described above for FIG. 1. When $V_O$ is at "1" so that transistor Q0 is turned on and needs drive current, $\overline{V}_I$ is at "1" (since $V_I$ is at "0") to place transistor Q6 at its maximum conductive level and enable the requisite current to flow to the Q0 base. Conversely, when $V_O$ is at "0" so that transistor Q0 is off, $\overline{V}_I$ is at "0" (since $V_I$ is at "1") to place transistor Q6 at its minimum conductive level and reduce the current provided from the $V_{CC}$ supply.

Figure 3:
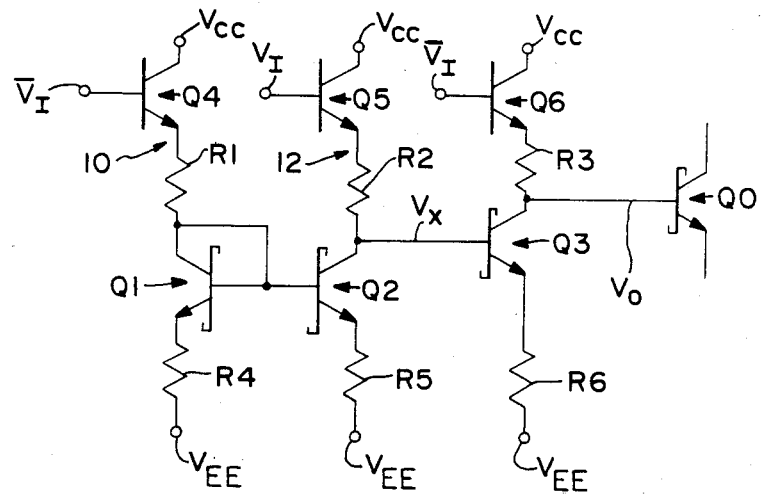
FIG. 3 is a circuit diagram of an embodiment of a differential-input signal translator in accordance with the invention.

FIG. 3 depicts a differential-input ECL-to-TTL bipolar translator for converting ECL input $V_I$ into TTL output $V_O$ for driving phase splitter Q0. The translator of FIG. 3 again includes transistors Q1-Q3 and resistors R1-R6 arranged in the same manner and having the same characteristics as in FIGS. 1 and 2. Resistors R4 and R5 in FIG. 3 perform the function described previously.

As in FIG. 2, input $V_I$ in FIG. 3 is provided to transistor Q5 which is collector-emitter connected between the $V_{CC}$ supply and resistor R2. The differential input is provided by a device circuit consisting of transistor Q4 whose base now receives complementary input $\overline{V}_I$. Transistor Q4 is collector-emitter connected between the $V_{CC}$ supply and resistor R1 in stack 10. Complementary input $\overline{V}_I$ is also supplied to the base of current-control transistor Q6 which is collector-emitter connected between the $V_{CC}$ supply and resistor R3. Inputs $V_I$ and $\overline{V}_I$ may, of course, be reversed.

The translator of FIG. 3 has the same switching points and input/output logical levels as those described above for FIGS. 1 and 2. When $V_I$ changes by $\Delta V$, $\overline{V}_I$ changes by approximately $\Delta V$ in the opposite direction. Consider the situation in which $\Delta V$ is positive. In looking first at the effect on $V_X$ caused only by transistor Q5, its emitter rises by $\Delta V$ so as to cause $V_X$ to rise by the same amount. Looking next at the effect on $V_X$ caused by transistor Q4, its emitter drops by $\Delta V$ causing the current through stack 10 to drop by $\Delta V/R_1$. The current through stack 12 is the same as the current through stack 10 and therefore likewise drops by $\Delta V/R_1$. The voltage across the Q5 base-emitter junction does not change significantly as the current through stack 12 changes. The voltage across resistor R2 then drops by $(R_2/R_1)\Delta V$ which equals $\Delta V$ because $R_1$ and $R_2$ are equal, causing $V_X$ to rise another $\Delta V$. Consequently, the total change in $V_X$ is $2\Delta V$ in the same direction as the change in $V_I$.

When $V_I$ is raised to "1", $V_X$ rises to its high level so as to turn on transistor Q3 and bring $V_O$ down to "0". Substantially the reverse occurs when $V_I$ drops to "0". $V_X$ drops causing transistor Q3 to turn off and bring $V_O$ up to "1". The total potential $V_X$ swing is $2V_{BE}$.

Transistor Q6 in FIG. 3 functions in the manner described above for FIG. 2 to improve power utilization.

$R_1$ and $R_2$ are each preferably 4,000 ohms in the translators of FIGS. 1-3. $R_3$ is preferably 5,000 ohms. $R_4$, $R_5$, and $R_6$ are each preferably 100 ohms.

Methods for manufacturing the various elements of the present translators are well known in the semiconductor art. Each of them is preferably manufactured as a monolithic integrated circuit according to conventional planar processing techniques using oxide isolation to separate active regions on a semiconductor wafer.

Transistors Q1 and Q2 are matched to each other—i.e., they have the same orientation and geometry and are physically near each other. Transistor Q6 is similarly matched to transistor Q4 and/or transistor Q5.

While the invention has been described with reference to particular embodiments, this description is solely for the purpose of illustration and is not to be construed as limiting the scope of the invention claimed below. For example, semiconductor elements of opposite polarity to those described above may generally be employed to accomplish the same results; in this case, $V_{BE}$ is negative in value. Thus, various modifications, changes, and applications may be made by those skilled in the art without departing from the true scope and spirit of the invention as defined by the appended claims.

What is claimed is:

1. A signal translator for converting an input voltage signal into an output voltage signal at a different voltage level wherein: a first bipolar transistor has a collector coupled to one end of a first impedance element, a base connected directly to the collector, and an emitter coupled to a first voltage supply; a like-polarity second bipolar transistor has a collector coupled to one end of a second impedance element, a base connected to the other base, and an emitter coupled to the first supply; a like-polarity output bipolar transistor has a collector which provides the output signal and is coupled to one end of an output impedance element whose other end is coupled to a second voltage supply, a base coupled to the collector of the second transistor, and an emitter coupled to the first supply; a like-polarity input bipolar transistor has a collector coupled to the second supply, a base which receives the input signal, and an emitter coupled to the other end of one of the first and second impedance elements; and device means provides a selected voltage to the other end of the other of the first and second impedance elements; characterized by: an impedance element coupled between the first supply and the emitter of the first transistor; and an impedance element coupled between the first supply and the emitter of the second transistor.

2. A translator as in claim 1 characterized in that the device means comprises at least one diode coupled between the second supply and said other end of the second impedance element in the normal conductive direction of the base-emitter junction of the second transistor, the emitter of the input transistor thereby being coupled to said other end of the first impedance element.

3. A translator as in claim 2 characterized by a like-polarity current-control bipolar transistor having a collector coupled to the second supply, a base which receives the input signal, and an emitter coupled to said other end of the output impedance element.

4. A translator as in claim 3 characterized in that each impedance element is a resistor.

5. A translator as in claim 1 characterized in that the device means comprises at least one diode coupled between the second supply and said other end of the first impedance element in the normal conductive direction of the base-emitter junction of the first transistor, the emitter of the input transistor thereby being coupled to said other end of the second impedance element.

6. A translator as in claim 5 characterized by a like-polarity current-control bipolar transistor having a collector coupled to the second supply, a base which receives a signal complementary to the input signal, and an emitter coupled to said other end of the output impedance element.

7. A translator as in claim 6 characterized in that each impedance element is a resistor.

8. A translator as in claim 1 characterized in that the device means comprises a further like-polarity input bipolar transistor having a collector coupled to the second supply, a base, and an emitter coupled to said other end of the first impedance element, the emitter of the input transistor thereby being coupled to said other end of the second impedance element.

9. A translator as in claim 8 characterized in that the base of the further input transistor receives a signal complementary to the input signal.

10. A translator as in claim 9 characterized by a like-polarity current-control bipolar transistor having a collector coupled to the second supply, a base which receives the signal complementary to the input signal, and an emitter coupled to said other end of the output impedance element.

11. A translator as in claim 10 characterized in that each impedance element is a resistor.

* * * * *